United States Patent
Satou et al.

(10) Patent No.: US 7,887,669 B2
(45) Date of Patent: Feb. 15, 2011

(54) VACUUM PROCESSING APPARATUS

(75) Inventors: Kouhei Satou, Kudamatsu (JP); Go Miya, Hachioji (JP); Hiroshi Akiyama, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 627 days.

(21) Appl. No.: 11/683,040

(22) Filed: Mar. 7, 2007

(65) Prior Publication Data

US 2008/0110400 A1    May 15, 2008

(30) Foreign Application Priority Data

Nov. 10, 2006  (JP) .............................. 2006-305138

(51) Int. Cl.
  *C23F 1/00*  (2006.01)
  *H01L 21/306*  (2006.01)
(52) U.S. Cl. .................................. 156/345.1
(58) Field of Classification Search .............. 156/335.1, 156/345.1
  See application file for complete search history.

(56) References Cited

U.S. PATENT DOCUMENTS

| | | | |
|---|---|---|---|
| 4,612,077 A * | 9/1986 | Tracy et al. | 156/345.34 |
| 5,597,439 A * | 1/1997 | Salzman | 156/345.33 |
| 6,178,918 B1 * | 1/2001 | van Os et al. | 118/723 R |
| 6,497,783 B1 * | 12/2002 | Suzuki et al. | 156/345.1 |
| 7,229,666 B2 * | 6/2007 | Mardian et al. | 427/248.1 |
| 2007/0087296 A1 * | 4/2007 | Kim et al. | 431/181 |

FOREIGN PATENT DOCUMENTS

| | | |
|---|---|---|
| JP | 62-290885 | 12/1987 |
| JP | 10-064881 | 3/1998 |

* cited by examiner

*Primary Examiner*—Michael Cleveland
*Assistant Examiner*—Keath T Chen
(74) *Attorney, Agent, or Firm*—Antonelli, Terry, Stout & Kraus, LLP.

(57) ABSTRACT

The invention provides a plasma processing apparatus for processing a wafer mounted on a sample stage placed in a vacuum processing chamber using a plasma generated in the vacuum chamber. The plasma processing apparatus comprises a plate placed in the vacuum processing vessel above and opposed to the wafer, the plate having a through hole through which a first processing gas is introduced; a first and second cylindrical member arranged vertically and adjacently; and means communicating with the gap between the first and second cylindrical member for supplying a second processing gas. The wafer is processed while the first processing gas and the second processing gas having different compositions are supplied.

7 Claims, 11 Drawing Sheets

(a)

(b)

(a)

(b)

VACUUM PROCESSING APPARATUS

The present application is based on and claims priority of Japanese patent application No. 2006-305138 filed on Nov. 10, 2006, the entire contents of which are hereby incorporated by reference.

BACKGROUND OF THE INVENTION

1. Field of the Invention

This invention relates to a vacuum processing apparatus for processing semiconductor wafers or other substrate samples in a decompressed processing chamber in a vacuum vessel while a processing gas is introduced into the processing chamber.

2. Description of the Related Art

Conventionally, in a vacuum processing apparatus for processing semiconductor wafers or other substrate samples to manufacture semiconductor devices, a processing chamber is placed in a vacuum vessel and decompressed to a predetermined degree of vacuum, and a processing gas is introduced into the processing chamber to form a desired feature on the semiconductor wafer surface. For example, an electric field is supplied from outside the vacuum vessel to a reactive gas introduced into the processing chamber to turn it into a plasma. By physical and chemical reactions with reactive particles such as ions and other charged particles and radicals in the plasma, a thin film previously formed on the wafer surface is processed into a desired feature.

The demand for higher integration of semiconductor devices requires such a vacuum processing apparatus to process a substrate surface with higher definition and accuracy. To meet such requirement, the sample surface must be processed more uniformly. For example, if the processing result significantly varies at different sites on the sample surface, a semiconductor device processed with a larger deviation from the desired feature fails to reach expected performance as compared with other devices, and the device manufacturing yield may decrease.

In view of this, for uniform processing, the processing gas introduced into the processing chamber is required to have a more uniform density distribution in the processing chamber. That is, it is known that such gas distribution greatly affects the uniformity of processing performance. Thus, conventionally, the introduction of gas is designed so that the gas distribution is uniform on the semiconductor wafer surface. For example, the processing chamber is shaped like a cylinder, the sample stage placed in the processing chamber for mounting a semiconductor wafer thereon has a generally cylindrical shape, and they are arranged coaxially or concentrically. Thus the processing performance is made uniform in the circumferential direction of a disc-shaped semiconductor wafer sample.

However, the temperature of a semiconductor wafer during processing and reaction products generated in processing the semiconductor wafer have radially nonuniform distribution. Recently, there is a demand for taking this into consideration to realize more uniform processing within the semiconductor wafer surface. For example, in a technique for enhancing the uniformity of processing performance, the component ratio of materials constituting a processing gas is varied radially with respect to the semiconductor wafer, and such a processing gas is supplied into the processing chamber above the semiconductor wafer so that each component has a different distribution above the semiconductor wafer.

An example conventional technique like this is disclosed in JP 62-290885A. In this conventional technique, cells are placed at the upside of the processing chamber and opposed to the semiconductor wafer. Processing gases of different species and flow rates are supplied to the electrode in the cells. A plurality of introduction holes for introducing the processing gases into the processing chamber are provided in communication with the cells, respectively. Gases of different gas species and gas flow rates are introduced from the gas introduction holes.

According to the configuration of such conventional technique, processing gases are introduced from a plurality of locations including the vicinity of the central axis and the vicinity of the outer periphery of the processing chamber into a space for plasma excitation and diffusion of the processing gases above the sample stage for mounting a wafer. Processing gases of different gas species and gas flow rates are introduced from these introduction locations to obtain a different concentration distribution for each gas species on the wafer surface.

In such conventional technique, in a processing chamber having a large space between the locations for introducing processing gases and the sample stage, the gas concentration distribution is flattened due to gas diffusion even if processing gases of different gas species and gas flow rates are introduced from different locations including the vicinity of the central axis and the vicinity of the outer periphery. Hence it is difficult to produce a biased distribution of gas concentration on the wafer surface. To overcome this difficulty, the variation of gas concentration distribution on the wafer surface can be increased by introducing processing gases from positions nearer to the wafer, e.g., from the side face of the processing chamber beside the above-mentioned space or from the surface on the outer periphery side of the sample stage (JP 10-064881A).

However, in the above conventional techniques, the following point is not sufficiently taken into consideration. In the conventional technique where gas is introduced from the vicinity of the wafer position to increase the variation of gas concentration distribution on the semiconductor wafer surface, introduction holes for introducing the processing gas must be provided on the inner surface of the processing chamber such as the side face of the processing chamber or the outer surface of the sample stage. Depending on the shape of the introducing hole, the distribution of the processing gas component in the processing chamber may be significantly deviated from the axisymmetrical distribution. Thus, unfortunately, the axisymmetrical plasma density in the processing chamber cannot be achieved, and the processing uniformity is significantly impaired.

SUMMARY OF THE INVENTION

An object of the invention is to provide a vacuum processing apparatus capable of uniformly processing a sample placed on the sample stage in the processing chamber.

The above object is achieved by a plasma processing apparatus for processing a wafer mounted on a sample stage placed in a vacuum processing chamber using a plasma generated in the vacuum chamber, the plasma processing apparatus comprising: a plate placed in the vacuum processing vessel above and opposed to the wafer, the plate having a through hole through which a first processing gas is introduced; a gap space having a generally cylindrical shape formed in the processing chamber; and means communicating with the gap for supplying a second processing gas, wherein the wafer is processed while the first processing gas and the second processing gas having different compositions are supplied.

According to the invention, it is advantageously possible to provide a vacuum processing apparatus capable of uniformly processing a semiconductor wafer so that gas supply in the space above the sample is made more uniform in the circumferential direction of the sample.

DETAILED DESCRIPTION OF THE PREFERRED EMBODIMENTS

Embodiments of the vacuum processing apparatus according to the invention will now be described with reference to the drawings.

First Embodiment

Figure 1:
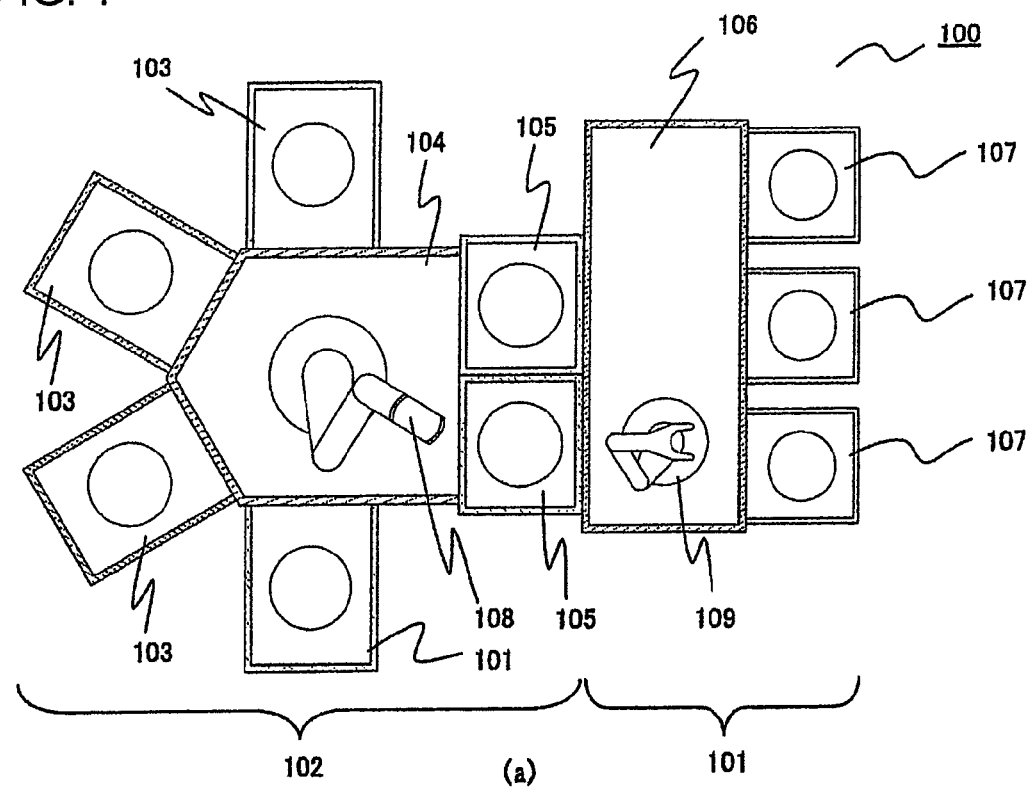
FIG. 1 schematically shows the overall configuration of a vacuum processing apparatus according to a first embodiment of the invention.
Figure 1:
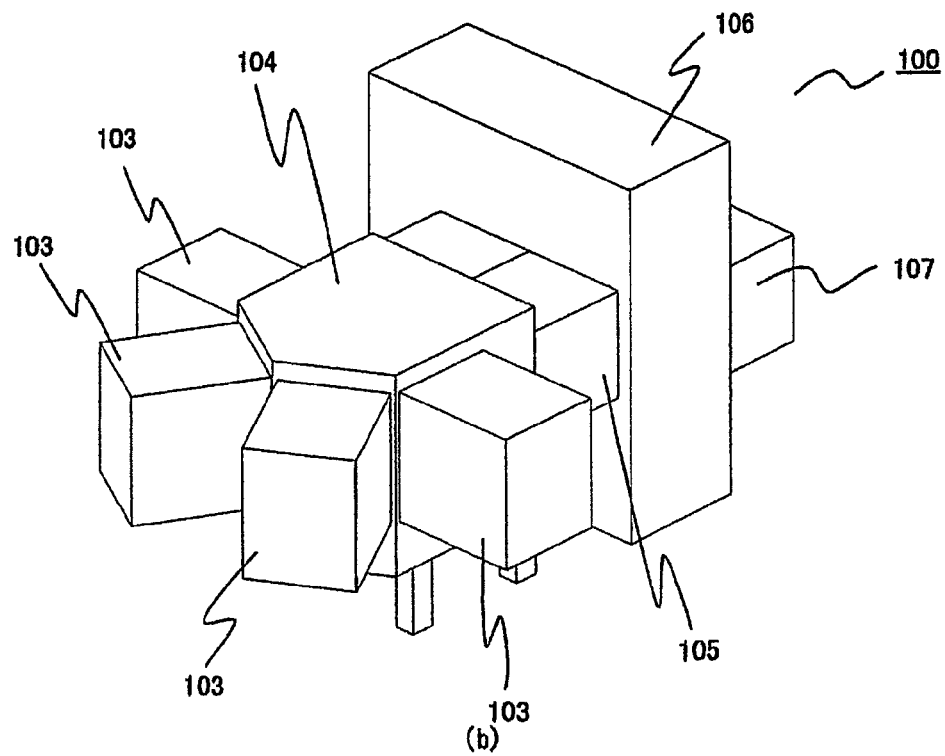

A first embodiment of the invention is described with reference to FIGS. 1 to 5. FIG. 1 schematically shows the overall configuration of a vacuum processing apparatus according to the first embodiment of the invention. FIG. 1A is a horizontal cross-sectional view schematically showing the configuration of the vacuum processing apparatus as viewed from above. FIG. 1B is a perspective view of the vacuum processing apparatus.

The vacuum processing apparatus 100 according to this embodiment shown in FIG. 1 is generally divided into an atmosphere side block 101 and a vacuum side block 102. In the atmosphere side block 101, a wafer is transferred, stored, or positioned under atmospheric pressure. In the vacuum side block 102, a wafer or other substrate sample is transferred and processed in a predetermined processing unit under a pressure reduced below atmospheric pressure. Between the location for these transferring and processing operations and the atmosphere side block 101, the vacuum processing apparatus 100 has a section for varying the pressure from atmospheric pressure to vacuum pressure or vice versa with a sample placed therein.

The atmosphere side block 101 includes a housing 106 having a generally rectangular solid shape equipped therein with an atmospheric transfer robot 109. The atmosphere side block 101 further includes a plurality of cassette stages 107 attached to the frontside (right side in the figure) of the housing 106. A cassette containing samples to be processed or to be cleaned can be mounted on the cassette stage 107.

The vacuum side block 102 includes a vacuum transfer vessel 104 having a generally polygonal (pentagonal in this embodiment) planar shape. Around the sidewall of the vacuum transfer vessel 104, the vacuum side block 102 includes four processing units 103 and two lock chambers 105. The processing unit 103 is equipped with a vacuum vessel having a processing chamber, in which a sample is transferred and processed under reduced pressure. The lock chamber 105 is placed between the vacuum transfer vessel 104 and the atmosphere side block 101, and exchanges a sample between the atmosphere side and the vacuum side. The vacuum side block 102 can be maintained at a reduced pressure of a high degree of vacuum.

The vacuum transfer vessel 104 includes a transfer chamber. A vacuum transfer robot 108 for transferring a sample between a lock chamber 105 and the processing chamber in a processing unit 103 under vacuum is placed at the center of the transfer chamber. A sample is mounted on the arm of the vacuum transfer robot 108 and transferred between a sample stage placed in the processing chamber of each processing unit 103 and a sample stage in any one of the lock chambers 105. Each of the processing units 103 and the lock chambers 105 communicates with the transfer chamber in the vacuum transfer vessel 104 through a channel that can be hermetically opened and closed by a valve.

Processing of a plurality of semiconductor wafers or other samples contained in a cassette mounted on one of the cassette stages 107 is started upon determination of a controller, not shown, that controls the operation of the vacuum processing apparatus 100, or upon receipt of a command from a controller of the manufacturing line on which the vacuum processing apparatus 100 is installed. Upon receipt of a command from the controller, the atmospheric transfer robot 109 retrieves a specific sample from the cassette, and transfers it to one of the two lock chambers.

The lock chamber 105 is sealed by closing the valve with the transferred sample being contained, and is decompressed to a predetermined pressure. Then, by opening the valve on the side facing the transfer chamber in the vacuum transfer vessel 104, the lock chamber 105 gets in communication with the transfer chamber. The arm of the vacuum transfer robot 108 stretches into the lock chamber 105, and transfers out the sample therein. The sample mounted on the arm of the vacuum transfer robot 108 is transferred into the evacuated processing chamber in one of the processing units 103, which is predetermined when the sample is transferred from the cassette.

After the sample is transferred into the processing chamber in one of the processing units 103, the valve between this processing chamber and the transfer chamber is closed to seal the processing chamber. Then a processing gas is introduced into the processing chamber, a plasma is generated in the processing chamber, and the sample is processed.

When completion of processing of the sample is detected, the above-mentioned valve is opened, and the sample is transferred out by the vacuum transfer robot 108 toward the lock chamber 105 in a reverse manner to its transfer into the processing chamber. After the sample is transferred into one of the lock chambers 105, the valve for opening and closing the channel between this lock chamber 105 and the transfer chamber is closed to seal the interior, and the pressure in the lock chamber 105 is raised to atmospheric pressure.

Then the valve on the housing 106 side is opened to allow the lock chamber 105 to communicate with the atmospheric transfer chamber in the housing 106. The sample is transferred from the lock chamber 105 to the original cassette and returned to the original position therein by the atmospheric transfer robot 109.

Figure 2:
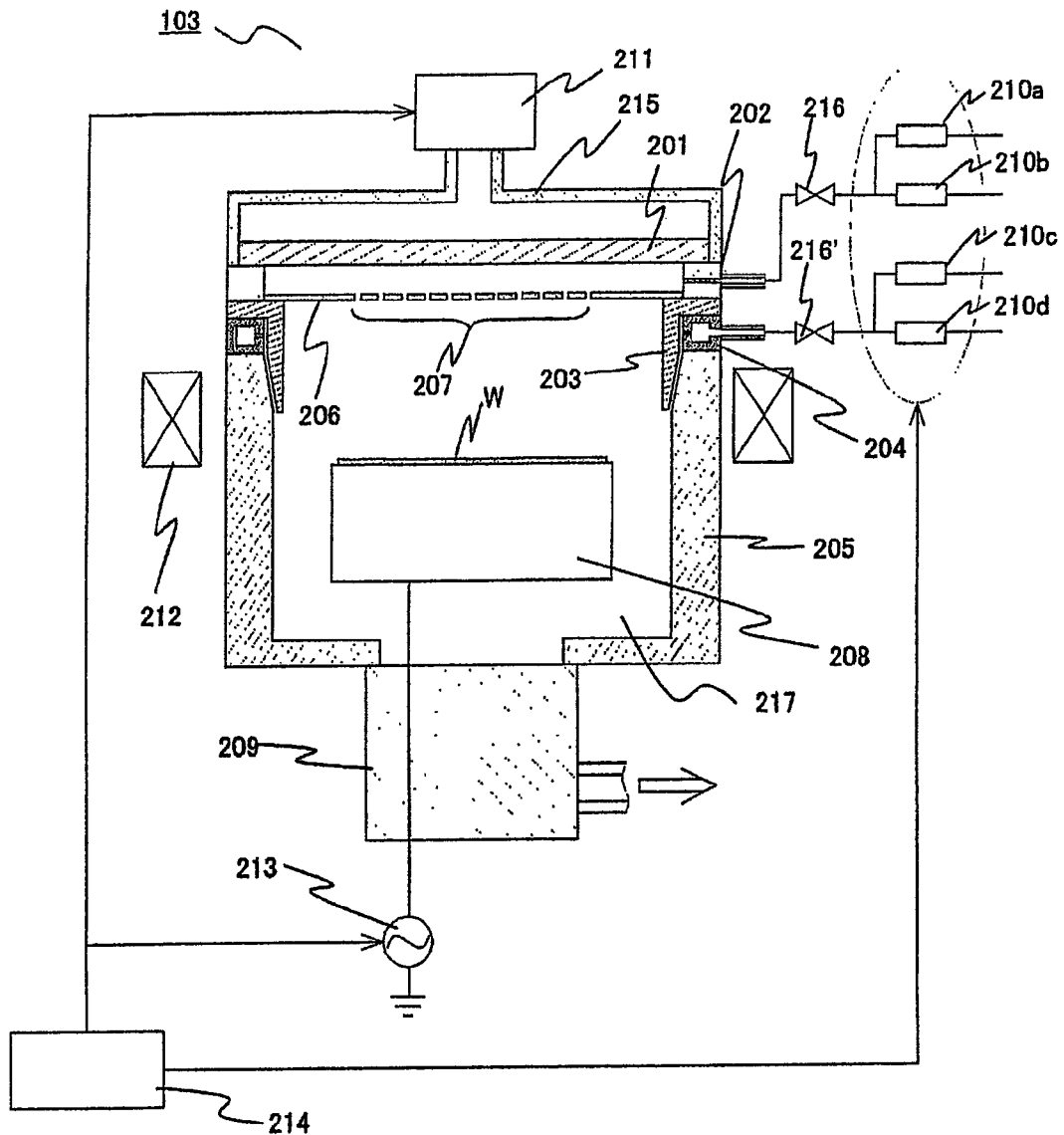
FIG. 2 is a vertical cross-sectional view schematically showing the configuration of the processing unit of the embodiment shown in FIG. 1.

FIG. 2 is a vertical cross-sectional view schematically showing the configuration of the processing unit of the embodiment shown in FIG. 1. In particular, among the processing units 103 in FIG. 1, FIG. 2 shows the configuration of one of the processing units 103 placed behind (upper-left side in FIG. 1) the vacuum transfer vessel 104. In this embodiment, these two processing units 103 are etching units for etching a film on the surface of the sample using a plasma.

In this figure, the processing unit 103 includes a vacuum vessel, a radio wave source placed at the upside thereof, and an exhaust apparatus placed below the vacuum vessel. The vacuum vessel has a lid 201 placed on top, a gas introduction ring 202, a gas diffusion ring 204, and a vacuum vessel wall member 205 having a generally cylindrical shape. They are each hermetically connected by sealing means such as O-rings, not shown, so that the gas pressure difference between the interior space and the exterior space can be maintained at a high level.

The vacuum vessel wall member 205 includes therein a processing chamber 217 having a generally cylindrical shape, which is formed by the inner wall of the vacuum vessel wall member 205. In the processing chamber 217, a sample stage 208 having a generally cylindrical shape is placed generally concentrically with the center of the processing chamber 217. A substrate sample W to be processed can be mounted on the upper surface of the sample stage 208.

From an opening of the vacuum vessel wall member 205 placed directly below the sample stage 208 at the bottom of the processing chamber 217, the space inside the processing chamber 217 is exhausted by a vacuum pump 209 and maintained at a high degree of vacuum (the arrow in the figure). The vacuum pump 209 is an exhaust apparatus connected to the bottom of the vacuum vessel wall 205. In particular, in this embodiment, the opening at the bottom of the vacuum vessel wall member 205, which serves as the inlet of the vacuum pump 209, is arranged generally concentrically with the sample stage 217. Gas and particles including products associated with the processing in the processing chamber 217 pass around the outer periphery of the sample stage 208 and through the space below the sample stage 208, and are exhausted concentrically with respect to the processing chamber 217.

As the processing gas for processing the sample, a gas containing a single material or a mixed gas containing a plurality of materials at a predetermined ratio and an optimal flow rate ratio is used for each processing condition. In this embodiment, as the processing gas used for etching, a first mixed gas and a second mixed gas having different gas species or gas flow rates can be simultaneously introduced into the space above the sample stage 208 in the processing chamber 217. As described later, the first mixed gas is provided at a position constituting the ceiling of the processing chamber 217 and opposed to the sample W mounted on the sample stage 208. The first mixed gas is introduced into the processing chamber 217 from a gas diffusion plate 206 having a plurality of through holes 207 for introducing gas. The through holes 207 are located in the vicinity of the center of the processing chamber 217.

The first mixed gas is introduced into the space between the lid 201 and the gas diffusion plate 206 from the gas introduction ring 202, which is placed above the sidewall upper end of the vacuum vessel wall member 205 and constitutes the vacuum vessel. The first mixed gas fills this space and enters the vacuum processing chamber through the plurality of through holes 207 below the space. The gas diffusion plate 206 is made of a generally circular plate placed generally concentrically with the sample stage 208, and the outer edge of the gas diffusion plate 206 is supported. The through holes 207 are located in a concentric region with a diameter slightly smaller than that of the sample W. The processing gas that has entered the processing chamber 217 from the through holes 207 diffuses and spreads in the space inside the processing chamber 217. The introduction of the processing gas is regulated so that the processing gas has an approximately uniform distribution on the surface of the sample W.

The second mixed gas is introduced into the processing chamber 217 from a gas diffusion ring 204 placed above the upper end of the vacuum vessel wall member 205. The second mixed gas introduced from the gas diffusion ring 204 passes through a gap with a ring cover 203 and is introduced into the downside of the processing chamber 217 so as to travel from above the sample W on the outer periphery side of the sample stage 208 toward the sample W. The ring cover 203 covers the front of the gas diffusion ring 204 and constitutes the inner wall of the processing chamber 217. The introduced second mixed gas diffuses in the space inside the processing chamber 217 with a distribution of concentration that is high on and toward the outer periphery of the sample W and low at the wafer center.

The processing gas containing the first mixed gas and the second mixed gas thus introduced into the processing chamber 217 interacts with an electric and magnetic field from the radio wave source placed at the upside of the vacuum vessel and the magnetic field source placed around the vacuum vessel. Atoms and molecules in the gas are excited by electron cyclotron resonance and turned into a plasma. The radio wave source includes a magnetron 211 placed above the gas introduction ring 202 on top of the vacuum vessel and the lid 201 with its outer edge being mounted and held on the gas introduction ring 202. The radio wave source further includes a waveguide 215 for introducing radio waves from the magnetron 211 through the lid 201 into the processing chamber 217. Furthermore, a solenoid coil 212 for supplying a magnetic field into the processing chamber 217 is placed around the lid 201 or the vacuum vessel wall member 205.

The sample stage 208 includes therein an electrode made of conductor, to which a high-frequency bias power supply 213 is connected. High-frequency power applied by the high-frequency bias power supply produces a bias potential on the surface of the sample W, and charged particles in the plasma are attracted by the bias potential and collide with the surface of the sample W, thereby causing a physical reaction. On the other hand, radicals chemically react with the wafer surface. Synergy of these physical and chemical reactions advances etching of the surface of the sample W.

When a semiconductor wafer is etched as the sample W, the concentration of reaction products containing silicon is lower in the region on the outer periphery side of the sample W than in the center side, and the temperature differs between the outer periphery side and the center side of the surface of the sample W. Hence radial nonuniformity may occur in the processing of the sample W. In this embodiment, the gas species and gas flow rates of the first mixed gas and the second mixed gas are independently regulated to control the gas concentration distribution on the wafer surface. Thus the radial nonuniformity in processing performance due to the above factors is canceled to provide a uniform processing performance in the wafer radial direction.

More specifically, the first mixed gas is introduced from a duct communicating with a gas supply pipe coupled to the gas introduction ring 202. The second mixed gas is introduced from another duct communicating with a gas supply pipe coupled to the gas diffusion ring 204 opening/closing valves 216, 216' are provided on these ducts and regulate the introduction of the first and second mixed gas into the processing chamber 217, respectively. A plurality of supply pipes for supplying material gases are connected to each of the ducts. The flow rates of these material gases are regulated by flow rate regulators 210a, 210b, 210c, 210d, and the gases are supplied to each duct.

Next, the configuration for introducing the second mixed gas into the processing chamber 217 is described in detail with reference to FIG. 3, which is a vertical cross-sectional view schematically showing the configuration around the gas diffusion ring of the processing unit shown in FIG. 2.

In this figure, the gas diffusion ring 204 is mounted on the upper end of the grounded vacuum vessel wall member 205. The gas diffusion ring 204 is held by being sandwiched on its upper and lower face between the vacuum vessel wall member 205 and the ring cover 203 mounted on the gas diffusion ring 204. The gas diffusion ring 204 is a ring-shaped member having a rectangular cross section, and includes therein a gas channel 301, which is a ring-shaped communicating space. The outer peripheral sidewall of the gas diffusion ring 204 is exposed outside the vacuum vessel to constitute the vacuum vessel outer wall, to which a gas supply pipe 304 for introducing the second mixed gas into the gas channel 301 is coupled. On the other hand, gas introduction holes 302 are located on the inner peripheral sidewall of the gas diffusion ring 204 being disposed at almost the entire circumference of the processing chamber 217 or the sample stage 208 and communicate with the gas channel 301 therein. Gas flows out of the gas introduction hole 302 toward the inner periphery. The gas introduction hole 302 may be a slit formed along the circumferential direction and having a predetermined width. The second mixed gas passes through the gas channel 301 and a plurality of gas introduction holes 302, which penetrates the gas ring 204, and is introduced inward through the sidewall at the upside of the processing chamber 217 at a circumferentially predetermined flow rate.

The ring cover 203 is located above and inside the gas diffusion ring 204, and covers the gas introduction hole 302 at the inner peripheral sidewall of the gas diffusion ring 204. The ring cover 203 includes a flange sandwiched between the upper face of the gas diffusion ring 204 and the lower face of the gas introduction ring 202. The ring cover 203 further includes an extending portion continued from the flange and constituting the upper inner wall of the processing chamber 217. The extending portion extends downward so as to cover the inner wall of the gas diffusion ring 204 and the upper end of the vacuum vessel wall member 205.

The ring cover 203 is attached to the vacuum vessel with a gap 303 of a generally uniform width in the circumferential direction of the gas diffusion ring, where the surface of the extending portion facing toward the outside of the processing chamber 217 is opposed across the gap 303 to the inner peripheral wall of the gas diffusion ring 204 and the inner wall of the upper end of the vacuum vessel wall 205. According to this configuration, a gap 303' is formed between the inner peripheral wall of the gas diffusion ring 204 and the outer side face of the ring cover 203. The gap 303' further communicates with the opening 303'' of the gap 303 located generally circumferentially on the inner wall of the processing chamber 217 above the sample stage 208. The second mixed gas introduced from the gas introduction hole 302 of the gas diffusion ring 204 into the gap 303' passes through the gap 303 between the extending portion of the ring cover 203 and the upper end of the vacuum vessel wall 205, passes through the opening 303'' located at the lower end of the ring cover 203, and is introduced into the space in the processing chamber 217 where a plasma is generated.

The gap 303 in this embodiment is directed toward the center (inward) of the processing chamber 217 as it goes downward from the upper gap 303' facing toward the inner peripheral wall of the gas diffusion ring 204. Thus the lower portion of the ring cover 203 has a tapered shape where its outer peripheral surface is sloped toward the inside of the processing chamber 217. That is, the lower end is shaped so that its thickness in the inside-outside direction decreases downward. Furthermore, the portion of the vacuum vessel wall member 205 facing the outer peripheral surface of this lower end and constituting the gap for introducing gas has a tapered shape sloped outward, and its thickness in the inside-outside direction decreases upward.

The ring cover 203 and the vacuum vessel wall member 205 are located so as to face a plasma generated in the processing chamber 217. The gas diffusion ring 204 is covered therewith so as not to directly face the plasma. In this embodiment, the ring cover 203 and the vacuum vessel wall member 205 are illustratively made of an aluminum alloy base material covered with alumite ($Al_2O_3$) or other material having high plasma resistance. The gas diffusion ring 204, which is not directly exposed to plasma but allows the processing gas to flow therethrough, is illustratively made of stainless steel or other material having good corrosion resistance.

Like the vacuum vessel wall member 205, the ring cover 203 is shaped so that its inner wall exposed to plasma is concentric with the processing chamber 217. The ring cover 203 is located generally coaxial with the central axis of the sample stage 208. The gaps 303 are uniformly spaced generally circumferentially around the center of the sample W. Thus the effect of the gas introduced from the gaps 303 on the plasma processing of the surface of the sample W reduces circumferential nonuniformity, and enhances the circumferential uniformity of processing performance.

In this embodiment, a plurality of gas introduction holes 302 are provided in the gas diffusion ring 204 generally symmetrically with respect to the center of the sample stage 208 and discretely in the circumferential direction. Thus the axisymmetry is broken at the position of the gas introduction hole 302. However, the gas diffusion ring 204 is placed at a position not directly facing the plasma to prevent the gas introduction hole 302 from adversely affecting the symmetry of processing on the surface of the sample W.

More specifically, when the second mixed gas is introduced from the gas supply pipe 304 into the gas channel 301 communicating therewith and located inside the gas diffusion ring 204, the gas fills the gas channel 301, which is a space connected in a ring shape. At this time, part of the second mixed gas in the gas channel 301 starts to flow from the gas introduction hole 302 into the gap 303'.

However, in this embodiment, the shape including the diameter and height of the gas introduction hole 302 is small enough to prevent the second mixed gas from easily flowing therethrough, and hence the flow channel has a large resistance (or small conductance). Thus most of the second mixed gas fills the ring-shaped gas channel 301 at a predetermined pressure.

Thus the second mixed gas in the gas channel 301 reaches a predetermined pressure. Then the second mixed gas passes through the gas introduction hole 302 and flows into the gap 303' at a flow rate determined by the balance between the pressure difference relative to the interior of the gap 303' and the resistance in the flow channel of the gas introduction hole 302. Here, as described above, the gas introduction holes 302 are uniformly spaced along the inner periphery of the gas diffusion ring 204, and the gas channel 301 is filled with the second mixed gas. Thus, between the gas introduction holes 302, the difference in the amount of the second mixed gas supplied therethrough to the gap 303' is reduced.

However, in order to sufficiently reduce the difference in the amount of flow rate in a plurality of gas introduction holes 302, the diameter or height thereof must be significantly reduced, and working for realizing such configuration increases cost. Furthermore, unfortunately, in some cases, deformation occurs in the shape of the gas diffusion ring 204 subjected to such working, and makes it difficult to use the gas diffusion ring 204 as part of the vacuum vessel and maintain hermetic sealing thereof.

On the other hand, when the gas introduction hole 302 is shaped so as to reduce working cost and deformation, a large difference occurs in the flow rate between the plurality of gas introduction holes 302. In this case, if the second mixed gas is introduced into the processing chamber 217, nonuniformity occurs in the gas density and the distribution of plasma and reaction products on the sample W particularly in the circumferential direction. To solve this, in this embodiment, as described above, a ring cover 203 is placed inside the gas diffusion ring 204, and through the gap 303 therebetween, the processing gas is introduced into the processing chamber 217. This embodiment is configured so that the size of the gap 303 is larger than the diameter or height of the gas introduction hole 302.

The second mixed gas is introduced from the high-pressure gas channel 301 into the low-pressure gap 303' and flows from the gap 303' downward into the gap 303. The second mixed gas further diffuses while flowing through the decompressed gap 303. Then the second mixed gas flows into the processing chamber 217 from a gas introduction slit 303", which is an outlet of the gap 303 on the inner wall of the processing chamber 217. Thus the gas introduced from the gas introduction hole 302 into the gap 303' is provided with a sufficiently uniform flow rate and supplied to the processing chamber 217. Hence the second mixed gas flowing inward from the upper sidewall of the processing chamber 217 has a more uniform flow rate in the circumferential direction.

Figure 4:
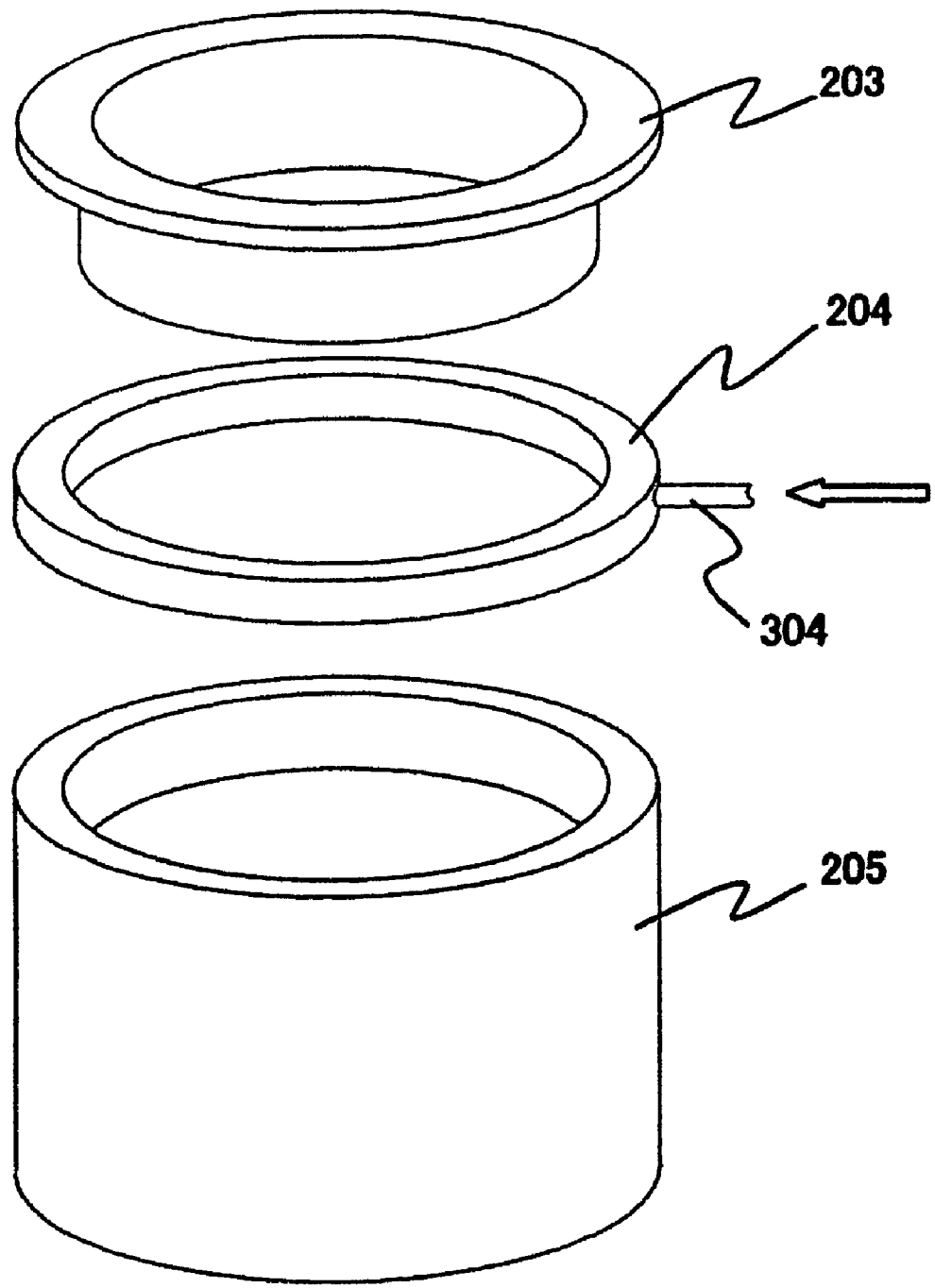
FIG. 4 is a perspective view schematically showing the configuration of the vacuum vessel and the gas diffusion ring.

FIG. 4 is a perspective view schematically showing the configuration of the vacuum vessel and the gas diffusion ring. As shown, in this embodiment, the ring cover 203, the gas diffusion ring 204, and the vacuum vessel wall member 205 are vertically stacked with the upper and lower face abutting each other.

Among them, the ring cover 203 and the gas diffusion ring 204 are configured to be detachable from the vacuum vessel for replacement by opening the vacuum vessel to atmosphere.

The grounded ring cover 203 constitutes the upper inner wall of the processing chamber 217 and faces the plasma. Hence reactants generated in the plasma or products derived from the surface of the sample W fly and attach to the ring cover 203, or the ring cover 203 is ablated by collision with charged particles in the plasma. Thus, repeated processing increases an adverse effect on the processing of the sample W and requires the ring cover 203 to be replaced. With regard to the gas diffusion ring 204, although covered with coating having high corrosion resistance, the coating peels off or suffers from corrosion. Then the gas diffusion ring 204 needs replacing. In this case, the vacuum vessel is opened to atmosphere, and the lid 201, the gas introduction ring 202, and the gas diffusion plate 206 are detached. Then the ring cover 203 and the gas diffusion ring 204 are detached in this order, and replacement parts are attached in the reverse order.

Figure 3:
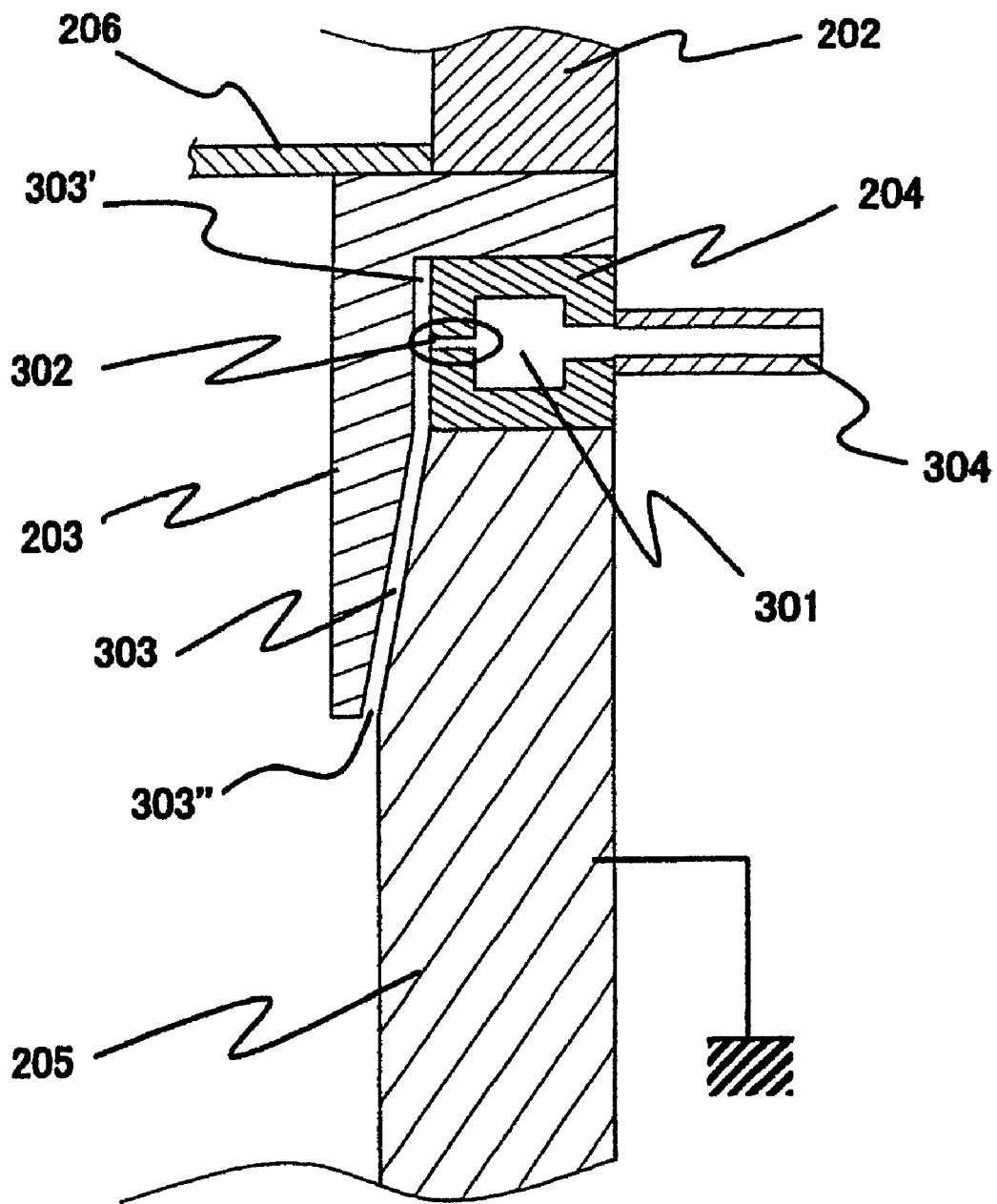
FIG. 3 is a vertical cross-sectional view schematically showing the configuration around the gas diffusion ring of the processing unit shown in FIG. 2.
Figure 5:
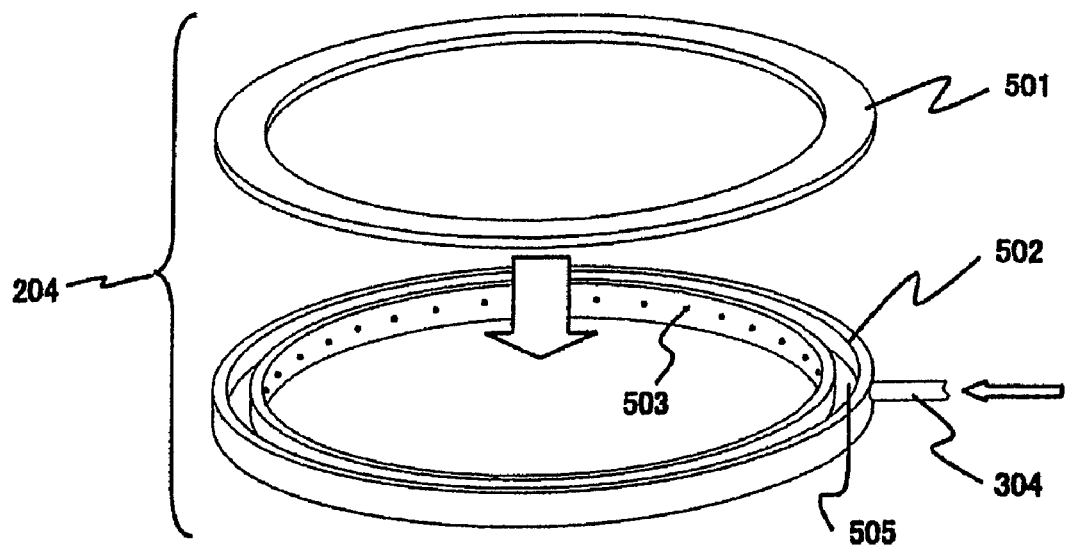
FIG. 5 is a perspective view schematically showing the configuration of the gas diffusion ring shown in FIG. 3.
Figure 5:
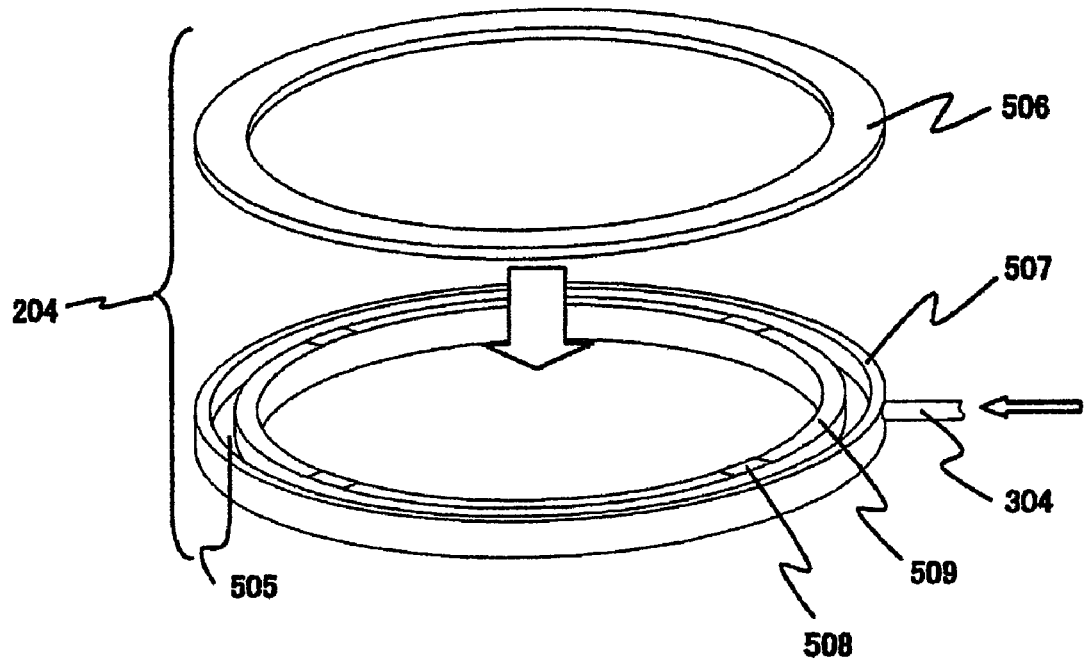

FIG. 5 is a perspective view schematically showing the configuration of the gas diffusion ring shown in FIG. 3. FIG. 5A shows an example where the gas introduction hole 302 of the gas diffusion ring 204 is composed of a plurality of through holes. FIG. 5B shows an example where the gas introduction hole 302 of the gas diffusion ring 204 is composed of one or more slits arranged circumferentially.

In these figures, the gas diffusion ring 204 is a vertical combination of a plurality of (two) members, which are hermetically connected to each other to form an inner space as a gas channel 301. In FIG. 5A, a ring-shaped upper member 501 is connected to a ring-shaped lower member 502 having a rectangular U-shaped vertical cross-section at its upper face of the walls on the inner periphery side and the outer periphery side thereof.

The lower member 502 is a ring-shaped member having a recess 505 between the inner peripheral wall and the outer peripheral wall. The recess 505 is combined with the upper member 501 to constitute a gas channel 301. As described above, the end of a gas supply pipe 304 is coupled to the outer wall. In the inner wall, a plurality of through holes 503 communicating with the recess 505 are uniformly spaced in the circumferential direction of the ring and at an generally equal height from the upper end or lower end. The through holes 503 serve as the gas introduction hole 302 when the upper member 501 is combined with the lower member 502.

As described above, the diameter of the through hole 503 is sufficiently smaller than the width or depth of the recess 505. Thus, when the second mixed gas is introduced, the gas channel 301 is entirely filled with this gas, thereby reducing the difference in flow rate of the gas flowing from the plurality of gas introduction holes 302. Although not shown, on the upper end of the walls of the lower member 502 on the inner periphery side and the outer periphery side, O-rings or other sealing members having high corrosion resistance are placed in conformity with the ring shape of the upper ends for sealing therebetween.

FIG. 5B shows, as in FIG. 5A, a configuration where an upper member 506 is mounted on and connected to a member 507 having a recess 505 therein and coupled to a gas supply pipe 304. In contrast to the example of FIG. 5A, a plurality of projections 508 are located circumferentially on the upper end face of the inner wall of the lower member 507, and the upper face of the projections 508 abuts the upper member 506 to form slits 509 between the lower member 507 and the upper member 506. The upper end face of the inner wall of the lower member 507 has a generally equal height from the lower end of the lower member 507, and a plurality of projections 508 are equally spaced in the circumferential direction.

The lower member 507 is connected to the upper member 506 at the upper end face on the outer periphery side. As in FIG. 5A, a sealing member is placed on this upper end face. With the upper member 506 being connected to the lower member 507, the recess 505 serves as a gas channel 301. The second mixed gas introduced from the gas supply pipe 304 fills the gas channel 301 and flows out of the slits 509 serving as the gas introduction hole 302 throughout the inner periphery of the gas diffusion ring 204.

The gas diffusion ring 204 of this embodiment can be made of an aluminum alloy covered with a material having high corrosion resistance. In view of not directly facing the processing chamber 217, the gas diffusion ring 204 can be made of SUS having high corrosion resistance. In particular, the mating surface of the upper and lower member, which forms slits of the gas supply hole 302, needs corrosion-resistant coating.

First Variation

Figure 6:
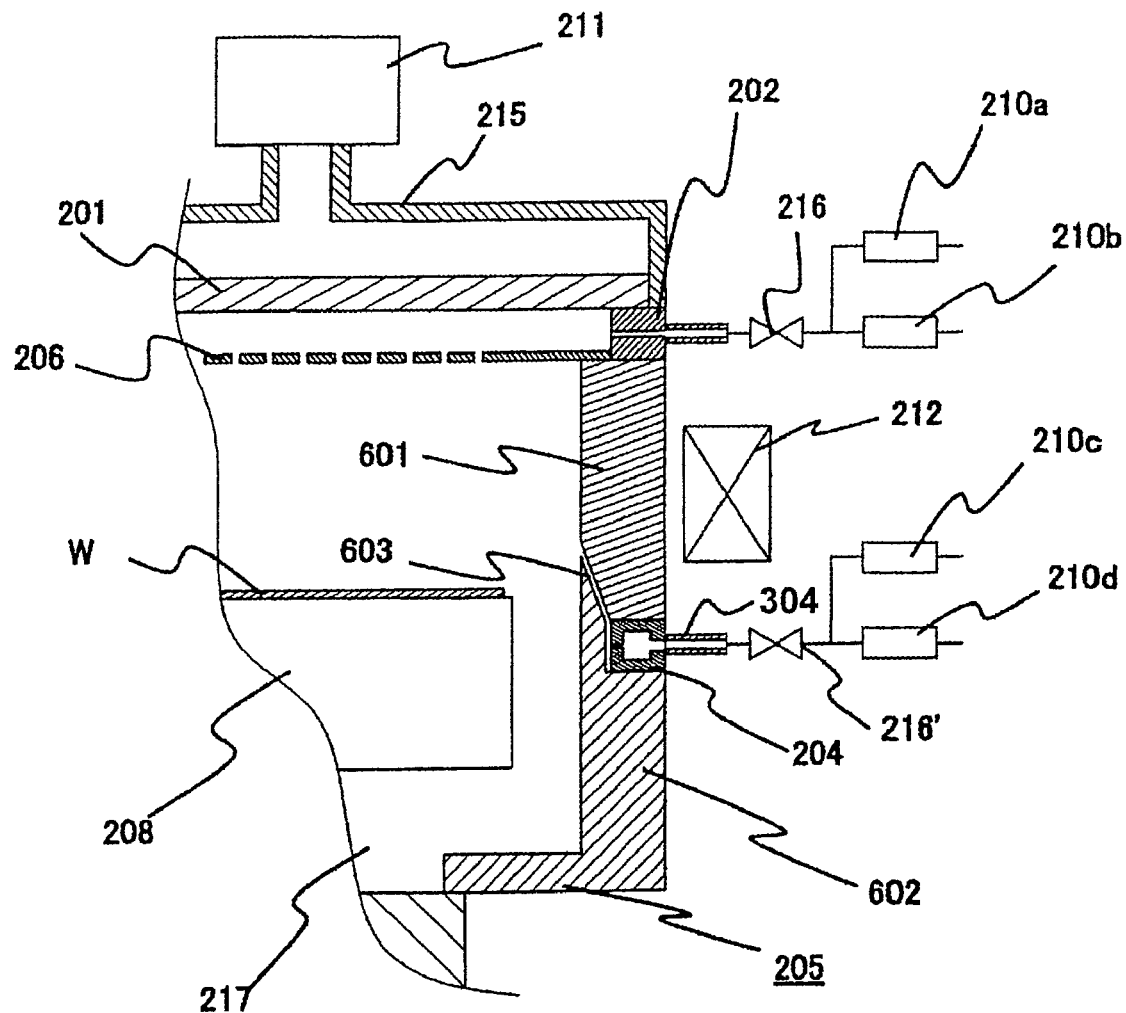
FIG. 6 is a vertical cross-sectional view schematically showing the configuration of the main part of a processing unit according to a variation of the first embodiment shown in FIG. 1.

Variations in the embodiment of the invention are described with reference to FIGS. 6 and 7. FIG. 6 is a vertical cross-sectional view schematically showing the configuration of the main part of a processing unit according to a variation of the embodiment shown in FIG. 1. The same elements as those in the embodiment of FIGS. 1 to 5 may be referred to by their reference numerals, but are not described in detail.

In the first embodiment, on the inner wall of the processing chamber 217, the second mixed gas is introduced downward from above the sample W toward the inside. However, as shown in this figure, this variation is different from the first embodiment in that, on the inner wall of the processing chamber 217, the second mixed gas is introduced upward toward the inside. In particular, the gas diffusion ring 204 is located lower than the sample W. Gas flows upward from this gas diffusion ring 204 toward the inside of the processing chamber 217.

In this variation, the vacuum vessel wall member 205 is composed of an upper wall member 601 and a lower wall member 602 arranged vertically, and a gas diffusion ring 204 is sandwiched and held therebetween. The outer peripheral wall of the gas diffusion ring 204 is exposed to atmosphere outside the vacuum vessel and constitutes the outer wall, and the inner peripheral wall is opposed to the lower wall member 602 across a gap 603.

The gap 603 is composed of a space between the inner peripheral wall of the gas diffusion ring 204 and the lower wall member 602, as well as a space thereabove between the upper wall member 601 and the lower wall member. Thus, from the inside of the gas diffusion ring, the gap 603 extends upward to the inner wall of the processing chamber 217. The opening of the gap 603 facing the processing chamber 217 is located with a generally uniform width in the circumferential direction above the sample stage 208. Thus the amount of the second mixed gas flowing from the gas diffusion ring 204 into the processing chamber 217 has a reduced circumferential variation on the outer periphery side of the sample W.

The upper end of the lower wall member 602 constitutes the inner wall of the processing chamber 217, where the portion constituting the gap 603 has a tapered shape sloped toward the inside as it goes upward. That is, the thickness of the lower wall member 602 in the inside-outside direction decreases upward, whereas the thickness of the upper wall member 601 opposed across the gap 603 increases upward. Also in this variation, the second mixed gas introduced into the gas diffusion ring 204 flows along the inner sidewall through the gap 903 and diffuses into the processing chamber 217. Thus the amount of gas introduced into the processing chamber 217 from the outer periphery side of the sample W has an enhanced uniformity, which enhances the uniformity of processing on the sample W.

Second Variation

Figure 7:
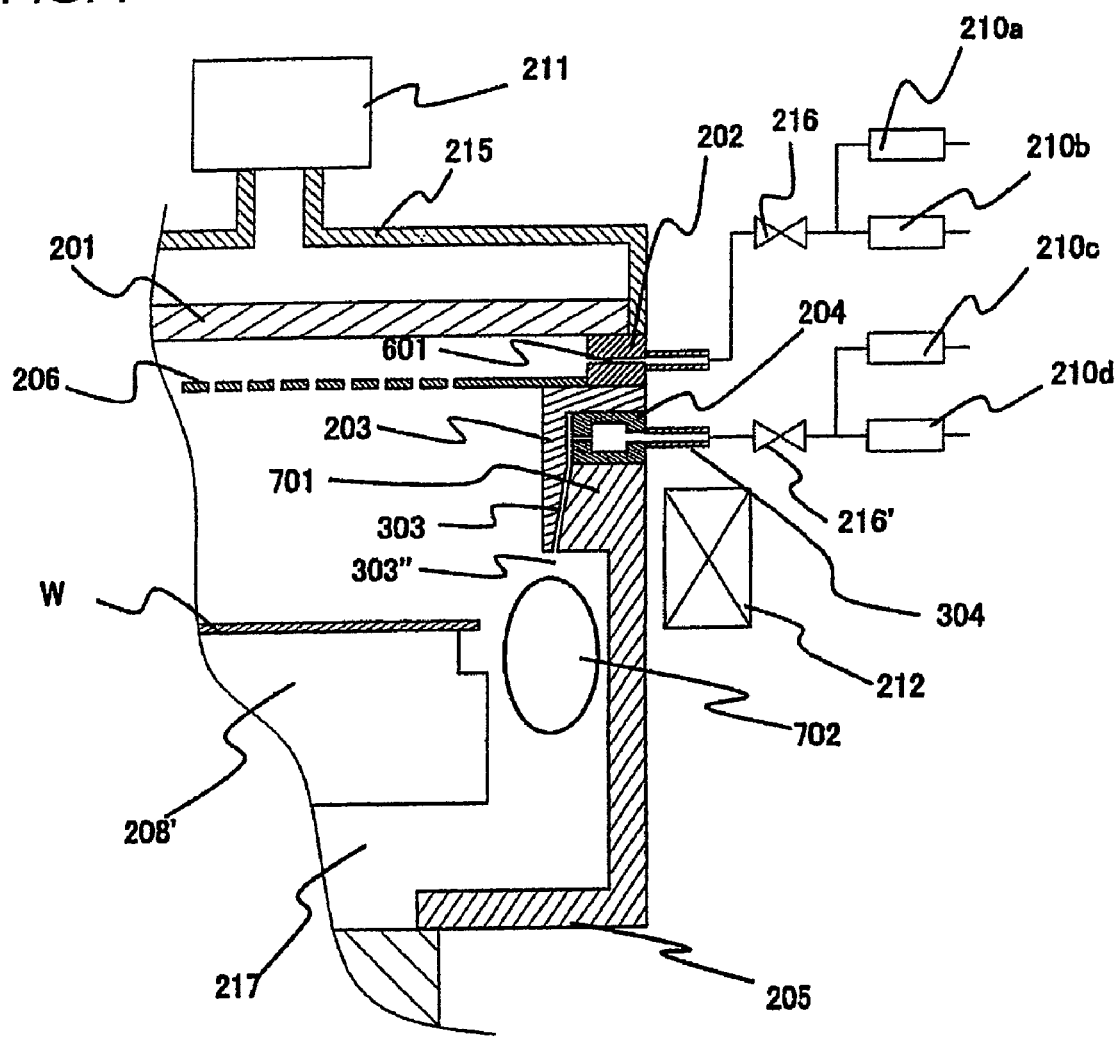
FIG. 7 is a vertical cross-sectional view schematically showing the configuration of the main part of a processing unit according to another variation of the first embodiment shown in FIG. 1.

FIG. 7 is a vertical cross-sectional view schematically showing the configuration of the main part of a processing unit according to another variation of the embodiment shown in FIG. 1. This variation is different from the first embodiment in that the gap 303 formed from the ring cover 203 and the vacuum vessel wall member 205 protrudes toward the sample stage 208. The same elements as those in the embodiment of FIGS. 1 to 5 may be referred to by their reference numerals, but are not described in detail.

In FIG. 7, the processing chamber 217 of this variation has a concentric configuration as in the first embodiment. However, the discharge space above the sample stage 208', in which a plasma is generated, is different in diameter from the space therebelow, where the lower space has a larger diameter. More specifically, the upper portion of the vacuum vessel wall member 205 protrudes toward the center of the processing chamber 217 to form a protrusion 701 having a larger thickness, and a ring cover 203 covers the protrusion 701 on the processing chamber 217 side. Furthermore, the opening 303" at the lower end of the gap 303 formed from the protrusion 701 and the ring cover 203 is located near a space 702 on the outer periphery side of the sample stage 208' below the discharge space where the diameter of the processing chamber 217 increases.

This variation allows gas and particles in the processing chamber 217 to flow more easily from the enlarged space 702 toward the space below the sample stage 208', thereby enhancing the exhaust efficiency. Furthermore, the second mixed gas introduced from the gap 303" into the processing chamber 217 extends at a position protruding toward the sample W on the sample stage 208', thereby further enhancing the uniformity of processing as well as locally affecting the processing of the outer periphery of the surface of the sample W. In this variation, the inner wall of the processing chamber 217 has a step. However, the inner wall of the processing chamber 217 may be gradually diverged downward (having a trapezoidal vertical cross section).

For example, the sample W is mounted on a projection constituting the mounting surface above the sample stage 208'. On the other hand, the sample stage 208' includes therein a temperature controller such as a refrigerant channel or heater placed concentrically or helically with respect to the center, which adjusts the temperature of the sample W to a desired distribution during processing. However, temperature adjustment by the above-mentioned temperature controller is difficult on the outer edge of the sample W, which is located on the outer periphery side of the projection. For example, the portion protruding (overhanging) beyond the outer periphery of the projection is greatly affected by heat from plasma.

The surface of such outer edge of the sample W has a temperature distribution in which the temperature is higher than at the inside and rapidly increases from the inside toward the outside. Thus, in etching the sample W, in order to process such outer edge with the same dimensions as the central surface, it is effective to locally increase the concentration of reaction products and adherents above and on the outer periphery of the sample W. According to the above configuration of this variation, the second mixed gas with a high composition of products and adherents is introduced from the position near the outer edge of the sample W with good uniformity in the circumferential direction of the outer periphery of the sample W. Thus the within-wafer and circumferential uniformity of processing of the sample W can be enhanced.

Second Embodiment

Figure 8:
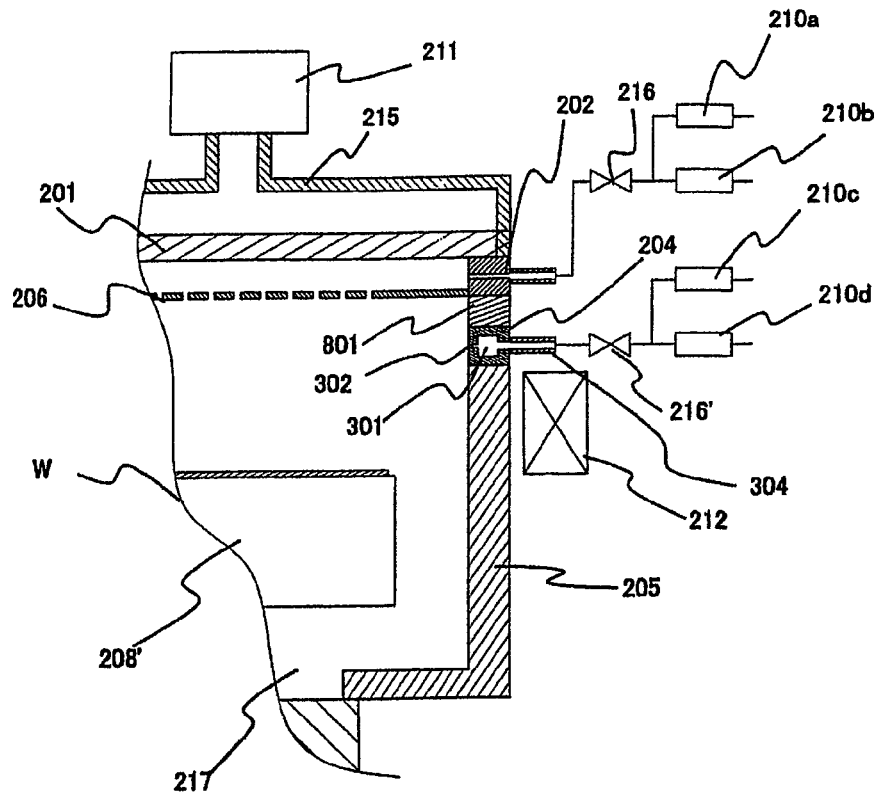
FIG. 8 is a vertical cross-sectional view schematically showing the configuration of the main part of a processing unit according to a second embodiment of the invention.

A second embodiment of the invention is described with reference to FIG. 8, which is a vertical cross-sectional view schematically showing the configuration of the main part of a processing unit according to the second embodiment of the invention. The same elements as those in the embodiment of FIGS. 1 to 5 may be referred to by their reference numerals, but are not described in detail. In this embodiment, in contrast to the first embodiment, the inner periphery side of the gas diffusion ring is not covered with a ring cover.

In the vacuum vessel of this embodiment, as in the first embodiment, a gas diffusion ring 204 is mounted above the sidewall upper end of a vacuum vessel wall member 205, and a ring-shaped vacuum vessel wall member 801 constituting the vacuum vessel is located above the gas diffusion ring 204. The gas diffusion ring 204 is sandwiched and held between the ring-shaped vacuum vessel wall member 801 and the sidewall upper portion of the lower vacuum vessel wall member 205.

In the gas diffusion ring 204 of this embodiment, its outer peripheral wall is exposed to ambient air outside the vacuum vessel and constitutes the vacuum vessel outer wall. The inner peripheral wall of the gas diffusion ring 204 is exposed inside the processing chamber 217 and faces the plasma. A second mixed gas, which is supplied from a gas supply pipe 304 coupled to the outer wall of the gas diffusion ring 204, is introduced into the processing chamber 217 through a gas introduction hole 302 located in the inner peripheral wall. Thus, in this embodiment, a first mixed gas is introduced toward the sample W from a gas diffusion plate 206 located at the upside of the processing chamber 217 and opposed to the sample W and the second mixed gas is introduced inward from the inner wall upper portion of the processing chamber 217 above the sample W.

The gas introduction hole 302 of this embodiment is composed of slits located at a generally equal height in the circumferential direction of the ring from the lower end of the inner sidewall of the gas diffusion ring 204. This configuration of the gas introduction hole 302 composed of the slits enhances the uniformity of the second mixed gas, which extends at the upper portion of the inner wall of the processing chamber 217 above the sample W and supplied from the periphery of the space above the sample W. This configuration can use the configuration shown in FIG. 5B, where the mating surface of vertically combined members on the inner periphery side has projections and recesses, which form slits when the upper member is connected to the lower member.

More specifically, the slits serving as the gas introduction hole 302 are composed of a plurality of continual or adjacent portions in the circumferential direction of the ring and arranged generally circumferentially. The width of the slit in the height direction is configured so that the second mixed gas from the gas supply pipe 304 fills the inner gas channel 301 at a high pressure enough to reduce nonuniformity in the flow rate of the second mixed gas flowing into the low-pressure processing chamber 217 through the slits located circumferentially.

Thus the second mixed gas is introduced uniformly from the inner wall of the cylindrical processing chamber 217 above the sample W toward the inside. Hence the density of gas and products or the distribution of plasma above the sample W can be affected to enhance the radial and circumferential uniformity of processing on the sample W. For example, the first mixed gas of a first composition being rich in materials with high etching reactivity is introduced from the gas diffusion plate 206 located above and opposed to the sample W, and the second mixed gas of a second composition being rich in gas components generating adherents is introduced from the outer periphery side of the sample W. Thus the concentration of products in the processing chamber 217 on the outer periphery side of the sample W has a reduced nonuniformity in the radial direction of the sample W, and the nonuniformity of processing on the sample W is reduced.

Third Variation

Another variation of the above embodiment is described with reference to FIG. 9. As in the foregoing, the same elements as those already described may be referred to by their reference numerals, but are not described in detail.

Figure 9:
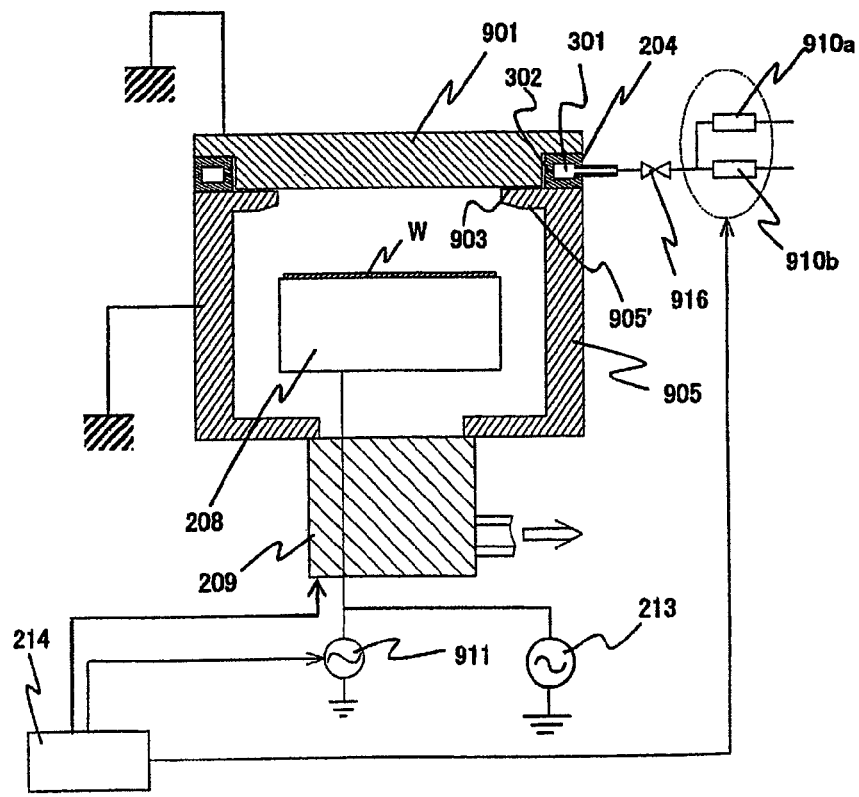
FIG. 9 is a vertical cross-sectional view schematically illustrating the configuration of the main part of a processing unit according to another variation of the first embodiment shown in FIG. 1.

FIG. 9 is a vertical cross-sectional view schematically illustrating the configuration of the main part of a processing unit according to another variation of the embodiment shown in FIG. 1. In contrast to the above embodiment, the processing unit of this variation does not include, above the vacuum vessel, a radio wave source that supplies an electric field for generating a plasma in the processing chamber inside the processing unit. Furthermore, the processing gas supplied into the processing chamber is supplied toward the central axis of the processing chamber from a gap arranged in a ring shape on the outer periphery side of the ceiling of the processing chamber.

In the processing unit according to this variation, a plasma is generated in the processing chamber 217 by an electric field between a sample stage 208 and an upper electrode 901. The sample stage 208 is located in the processing chamber 217 and includes an electrode to which electric power is supplied from a high-frequency power supply 911. The upper electrode 901 constitutes an upper lid of the vacuum vessel, is located above and opposed to the sample stage 208, and is coupled to ground potential. As in the embodiment shown in FIG. 2, the electrode in the sample stage 208 is coupled to a high-frequency bias power supply 213 and supplied with high-frequency power for producing a bias potential on the surface of the sample W.

The vacuum vessel of this variation includes a vacuum vessel wall member 905 constituting the sidewall and the bottom, an upper electrode 901 placed thereabove and constituting a lid member, and a gas diffusion ring 204 placed on the outer periphery side thereof and hermetically held therebetween for maintaining the pressure difference between the inside of the processing chamber 217 and the outside of the vacuum vessel. The upper electrode 901 is mounted above the sidewall upper end of the vacuum vessel wall member 905 via a gap. At this upper end, a flange 905' extends toward the central axis of the generally cylindrical vacuum vessel or processing chamber 217. The upper electrode 901, the vacuum vessel wall member 905, and the gas diffusion ring 204 sandwiched therebetween are coupled to ground potential to avoid abnormal discharge due to potential difference among them.

The gas diffusion ring 204 placed on the outer periphery side of the upper electrode 901 is supplied with a mixed gas via an opening-closing valve 916. The mixed gas is obtained by combining a plurality of (two) gas flows, where the flow rate of each gas is adjusted by a flow rate regulator 910a, 910b. The supplied mixed gas fills the inner gas channel 301 and flows through a gas introduction hole 302 located in the inner peripheral wall into a gap 903 between the gas diffusion ring 204 and the sidewall of the upper electrode 901 which is placed inside and opposed thereto. Then the mixed gas diffuses through the underlying gap 903 communicating below therewith between the upper electrode 901 and the flange 905', and flows into the processing chamber 217 along the lower surface of the upper electrode 901, which is the ceiling of the processing chamber 217.

The gap 903 is located circumferentially at the upside of the processing chamber 217 above the sample W because the flange 905' extends circumferentially at the upper end of the cylindrical vacuum vessel wall member 905. The width of the gap 903 is made generally uniform to reduce circumferential nonuniformity in the flow rate of the influent mixed gas.

Fourth Variation

Figure 10:
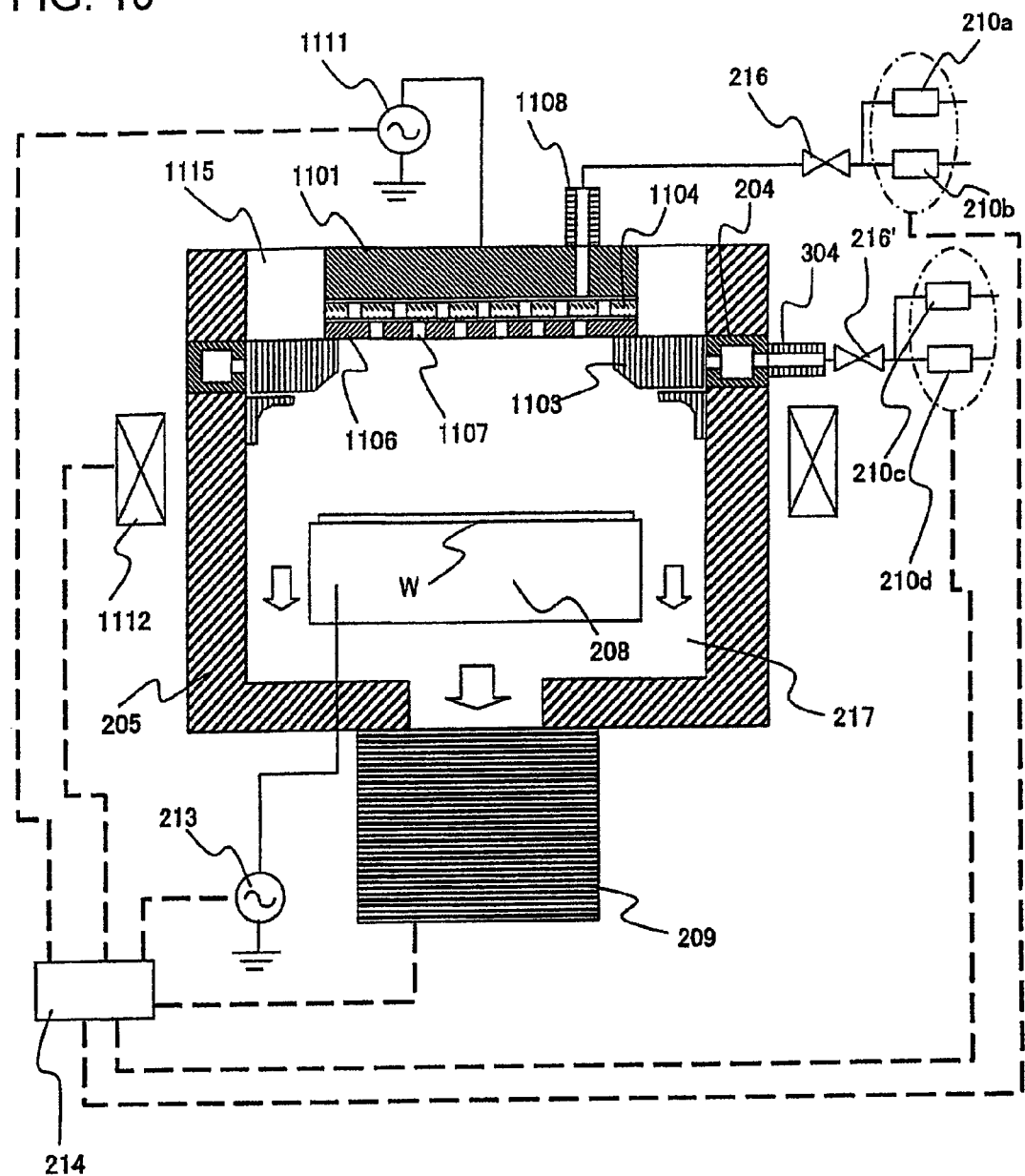
FIG. 10 is a vertical cross-sectional view schematically showing the configuration of the main part of a processing unit according to another variation of the first embodiment shown in FIG. 1.
Figure 11:
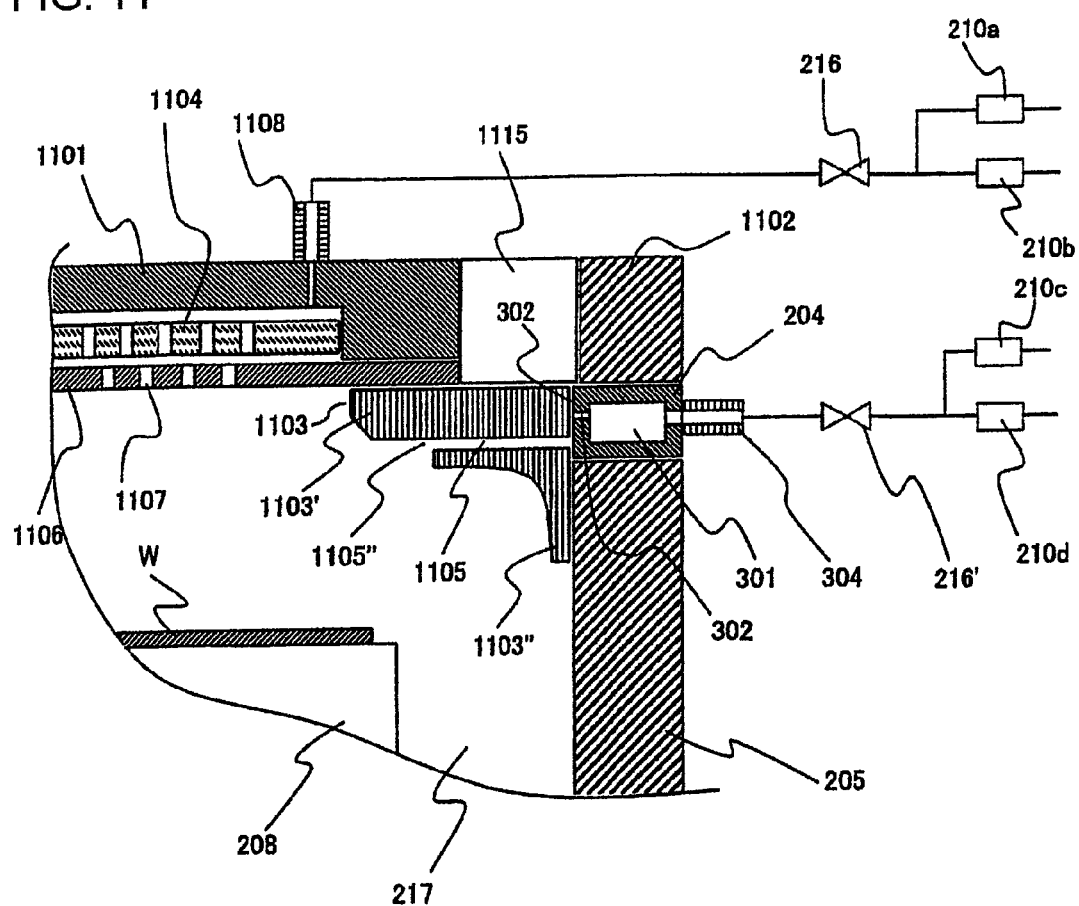
FIG. 11 is an enlarged vertical cross-sectional view showing the configuration in the vicinity of the gas diffusion ring of the processing unit according to the variation shown in FIG. 10.

Another variation of the embodiment of FIG. 1 is described with reference to FIGS. 10 and 11. FIG. 10 is a vertical cross-sectional view schematically showing the configuration of the main part of a processing unit according to another variation of the embodiment shown in FIG. 1. FIG. 11 is an enlarged vertical cross-sectional view showing the configuration in the vicinity of the gas diffusion ring of the processing unit according to the variation shown in FIG. 10.

In the variation shown in FIG. 10, the processing unit comprises a vacuum vessel including therein a processing chamber 217, and an exhaust apparatus placed below the vacuum vessel. An upper electrode 1101 is placed at the upside of the vacuum vessel and hermetically held between the inside and the outside of the vacuum vessel. The upper electrode 1101 is supplied with high-frequency power from a high-frequency power supply 1111, and supplies an electric field for plasma generation to the underlying processing chamber 217.

A gas diffusion plate 1106 is placed below the upper electrode, faces the processing chamber 217, and is exposed to plasma. The gas diffusion plate 1106 has through holes 1107, through which a first mixed gas is introduced. The gas diffusion plate 1106, which may be made of semiconductor such as silicon having high purity, is composed of a material acting as a conductor for high-frequency power. The gas diffusion plate 1106 constitutes the ceiling of the processing chamber 217 and covers a range equal to or wider than the diameter of the sample W. The gas diffusion plate 1106 faces the plasma generated in the space between the sample stage 208 and the gas diffusion plate 1106.

A gas supply pipe 1108 is coupled to the upper electrode 1101 shaped like a flat plate. As in the embodiment of FIG. 1, the first mixed gas is supplied to a gas diffusion space 1109 between the upper electrode 1101 and the gas diffusion plate 1106. The gas diffusion space 1109 extends in a range equal to or wider than the region where the through holes 1107 are formed in the underlying gas diffusion plate 1106. A gas distribution plate 1104 made of conductor is placed in the gas diffusion space 1109. The gas distribution plate 1104 has a plurality of through holes. The first mixed gas introduced into the gas diffusion space 1109 passes through these through holes, diffuses in the gas diffusion space 1109, and reaches the underlying gas diffusion plate 1106. In the gas diffusion space 1109, the gap between the gas diffusion plate 1104 and the overlying upper electrode 1101, and the gap between the gas diffusion plate 1104 and the underlying gas diffusion plate 1106 are configured in size to avoid abnormal discharge.

A dielectric ring 1115 made of quartz or other material is placed on the outer periphery side of the upper electrode 1101. The dielectric ring 1115 insulates the upper electrode 1101 from an upper ring 1102 placed therearound and grounded. Below the upper ring 1102, a gas diffusion ring 204 is placed between the upper ring 1102 and the sidewall of the vacuum vessel wall member 205.

As in the embodiment of FIG. 1, the gas diffusion ring 204 is supplied with a second mixed gas from a gas supply pipe 304. The second mixed gas is diffused from the inner peripheral side face of the gas diffusion ring 204 and introduced into the processing chamber 217. A sample stage 208 for mounting a sample W is placed in the processing chamber 217. High-frequency power is supplied from a high-frequency power supply 213 to the electrode inside the sample stage 208, and produces a bias potential on the surface of the sample W.

Furthermore, in this variation, inside the upper end of the outer periphery of the generally cylindrical processing chamber 217, a ring cover 1103 made of dielectric and shaped like a flat plate constitutes the ceiling of the processing chamber 217. The ring cover 1103 hermetically covers the lower face of the dielectric ring 1115 on the processing chamber 217 side and the lower face (the face on the processing chamber side) of the outer periphery of the gas diffusion plate 1106. The ring cover 1103 is vertically divided into two members, and the second mixed gas is introduced through a gap formed from these members into the processing chamber.

The sample W is processed as in the embodiment of FIG. 1. More specifically, from the through holes 1107 of the gas diffusion plate 1106 opposed to the sample mounting surface of the sample stage 208, the first mixed gas of a first composition is introduced into the underlying processing chamber 217. Simultaneously, from the inner wall of the processing chamber 217 on the upper outer periphery side above the sample W, the second mixed gas of a second composition is introduced toward the center of the processing chamber 217.

An electric field from the upper electrode 1101 excites the supplied first and second mixed gas into a plasma, by which the sample W is etched. Reaction products associated with the processing and particles in the plasma migrate downward through the space of the processing chamber 217 on the outer periphery side of the sample stage 208, and are ejected from an opening located at the bottom of the vacuum vessel, which serves as the inlet of a vacuum pump 209. The processing chamber 217, the sample stage 208, and the vacuum pump inlet are arranged concentrically. The plasma, gas, and products in the processing chamber 217 have axisymmetrical distribution with respect to this center. Thus circumferential nonuniformity in the processing of the sample W is reduced with respect to the center of the sample W.

In this variation, a solenoid coil 1112 for supplying a magnetic field for plasma generation to the space of the processing chamber 217 above the sample W is placed on the outer periphery of the vacuum vessel. However, the plasma may be generated solely by an electric field.

As shown in FIG. 11, the gas diffusion ring 204 is placed above the upper end of the vacuum vessel wall member 205. Furthermore, the upper ring 1102 is placed above the gas diffusion ring 204. These are hermetically attached so as to maintain the gas pressure difference between the inside and the outside of the vacuum vessel. The upper electrode 1101 shaped like a flat plate and constituting the lid of the vacuum vessel, the underlying gas diffusion plate 1106, and the dielectric ring 1115 are coupled to each other and moved up above the vacuum vessel wall member 205 together with the underlying ring cover 1103 when the processing unit is opened to atmosphere for maintenance and inspection.

At the upper end of the processing chamber 217 on the outer periphery side, the ring cover 1103 made of quartz or other dielectric covers the lower face of the dielectric ring 1115 on the processing chamber 217 side and the inner wall of the sidewall upper end of the grounded vacuum vessel wall member 205 on the processing chamber 217 side. In this variation, the ring cover 1103 is a vertical combination of a plurality of (two) members. The upper ring cover 1103' is coupled to the dielectric ring 1115, and the lower ring cover 1103" is engaged with the inner wall of the vacuum vessel wall member 205.

The gas diffusion ring 204 is placed on the outer periphery side of the ring cover 1103 and above the upper end of the vacuum vessel wall member 205. As in the first embodiment, the gas diffusion ring 204 constitutes the vacuum vessel and is exposed outside the vacuum vessel as its outer wall. The inner peripheral wall is opposed to the outer peripheral wall of the upper ring cover 1103' across a gap 1105'. The second mixed gas filling the gas channel 301 therein flows into the gap 1105' from the gas introduction hole 302 located in the inner peripheral wall.

The influent second mixed gas migrates downward in the gap 1105' and flows through a gap 1105 communicating therewith between the upper ring cover 1103' and the lower ring cover 1103" toward the center of the generally cylindrical processing chamber 217. Then the second mixed gas flows into the processing chamber 217 from an opening 1105" of the gap 1105 facing the processing chamber 217. The gap 1105 is located at the upside of the inner wall of the processing chamber 217 above the sample W and generally circumferentially on the outer periphery side of the sample W. The height of the gap 1105 is approximately uniform. Thus the inflow rate of the second mixed gas has a reduced nonuniformity in the circumferential direction of the sample W. Furthermore, the height of the gap 1105 is larger than the diameter or height of the gas introduction hole 302, thereby facilitating diffusion of the second mixed gas in this gap.

Thus the second mixed gas filling the gas channel 301 in the gas diffusion ring 204 flows inward into the gap 1105 through the gas introduction hole 302 composed of a plurality of through holes or at least one slit communicating with the gas channel 301. The second mixed gas turns around and diffuses in the gap 1105, and is introduced uniformly into the processing chamber from the opening 1105" of the gap 1105 facing the processing chamber 217. Such introduction of the processing gas increases radial or circumferential uniformity in the density distribution of products or other particles and plasma. Thus the uniformity of processing is enhanced.

Third Embodiment

A third embodiment of the invention is described with reference to FIG. 12, which is a vertical cross-sectional view schematically showing the configuration of the main part of a processing unit according to the third embodiment of the invention. As in the foregoing, the same elements as those already described may be referred to by their reference numerals, but are not described in detail.

Figure 12:
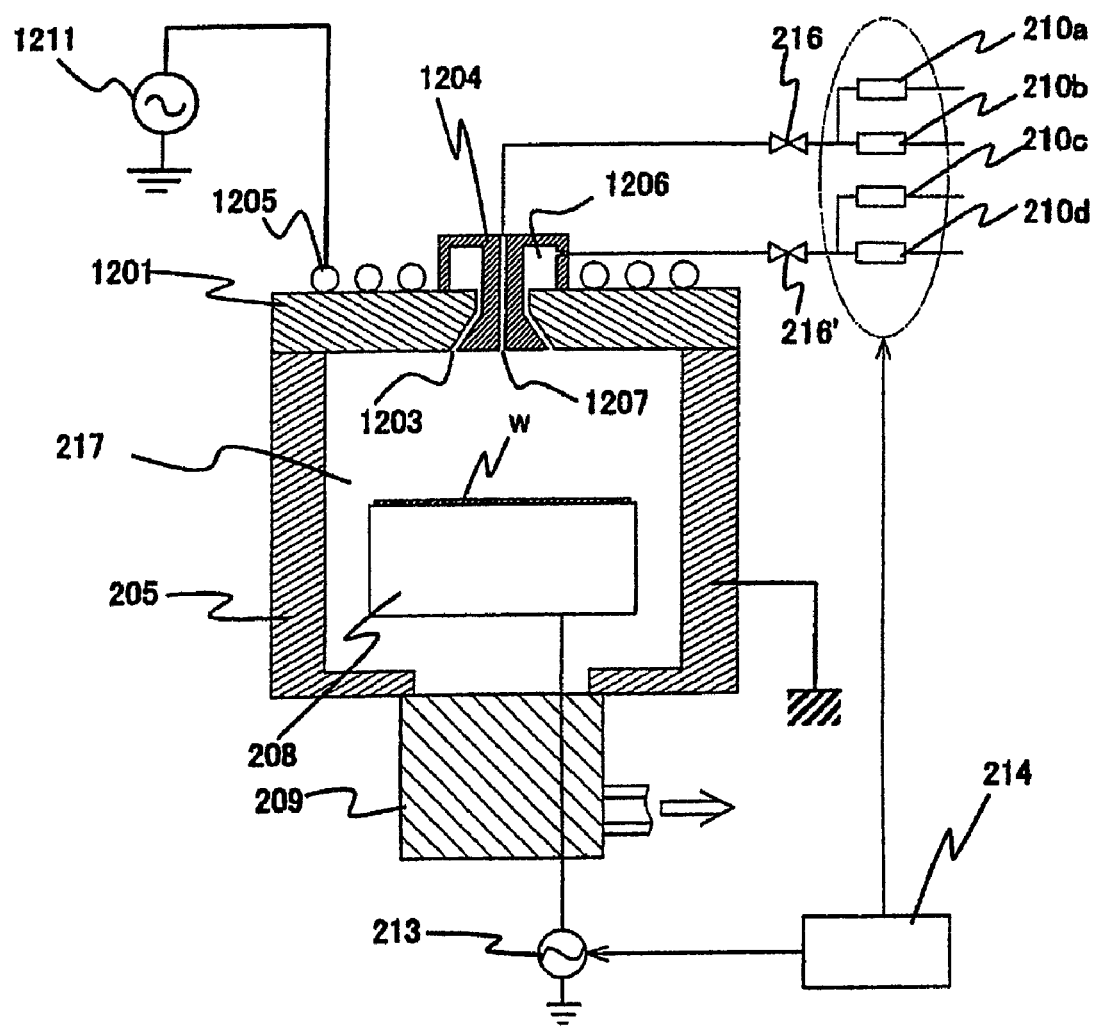
FIG. 12 is a vertical cross-sectional view schematically showing the configuration of the main part of a processing unit according to a third embodiment of the invention.

FIG. 12 primarily shows the vacuum vessel of the processing unit. The processing unit of this embodiment includes a vacuum vessel, an induction coil 1205 placed thereabove, and a vacuum pump 209, which is an exhaust apparatus placed below the vacuum vessel.

In contrast to the first and second embodiment, the means for supplying an electric field for plasma generation into the processing chamber 217 in the vacuum vessel according to this embodiment is the induction coil 1205 placed above a dielectric lid member 1201, which constitutes the vacuum vessel above the processing chamber 217. More specifically, in this embodiment, the induction coil 1205 is supplied with high-frequency power from a high-frequency power supply 1211. As a result, an electric field is induced in the space above the sample stage 208 in the processing chamber 217, and the processing gas introduced into the processing chamber 217 is excited into a plasma.

In the vacuum vessel in this embodiment, a lid member 1201 constituting a disc-shaped lid of the vacuum vessel is placed above the sidewall of the grounded, generally cylindrical vacuum vessel wall member 205. The lid member 1201 is made of dielectric so that an induced electric field can be introduced into the processing chamber 217 from the induction coil 1205, which is placed with a gap above the lid member 201 concentrically or helically with respect to the cylinder. The lid member 1201 is hermetically connected with the vacuum vessel wall member 205 to maintain the gas pressure difference between the inside and the outside of the processing chamber 217.

As in the embodiment shown in FIG. 1, the generally cylindrical processing chamber 217, the sample stage 208, and the opening at the bottom of the vacuum vessel wall member 205 serving as the inlet of the vacuum pump 209 are arranged concentrically. Furthermore, in this embodiment, the induction coil 1205 is also arranged outside the vacuum vessel concentrically with respect to the central axis of the sample stage 208 on the outer periphery side thereof.

Although not shown, a metal plate made of conductor is placed between the induction coil 1205 and the lid member 1201 so as to cover the upper surface of the lid member 1201, and functions as a so-called Faraday shield. This metal plate is radially provided with a plurality of slit-shaped notches across the windings of the induction coil 1205. The slit-shaped notches introduce the induced electric field into the processing chamber 217, and prevent interaction of the inner wall of the lid member 1201 with the induction coil 1205 due to capacitive coupling in the processing chamber 217.

At the center of the lid member 1201, a gas supply unit 1204 for supplying the processing gas into the processing chamber 217 is fit into the lid member 1201. More specifically, the gas supply unit 1204 is placed inside a hole at the center of the lid member 1201, and faces downward the inside of the processing chamber 217 and upward the outside thereof. The gas supply unit 1204 has at its center a gas introduction hole 1207 for introducing a first mixed gas into the processing chamber 217. Furthermore, a gap 1203 having a uniform size is located between the gas supply unit 1204 and the lid member 1201 generally circumferentially around the gas introduction hole 1207. A second mixed gas is introduced into the processing chamber 217 through the gap 1203.

The gas introduction hole 1207 is a through hole extending from the upper surface of the dielectric gas supply unit 1204 exposed outside the vacuum vessel to the lower surface opposed to the sample mounting surface of the sample stage 208 and exposed to plasma. The upper end of the gas introduction hole 1207 is coupled to a gas supply pipe for supplying the first mixed gas. The slit-shaped gap 1203 located on the outer periphery side of the gas introduction hole 1207 communicates with a ring-shaped gas channel 1206 coupled to a gas supply pipe of the second mixed gas and located in the upper portion inside the gas supply unit 1204. The second mixed gas passes through the gap 1203 and is introduced into the processing chamber 217 from above the sample W.

The outer peripheral wall of the gas supply unit 1204 having an axisymmetrical shape with respect to the center coaxial with the gas introduction hole 1207 is separated by the gap 1203 from the lid member 1201 into which the gas supply unit 1204 is fit. As shown, the gap 1203 has a divergent shape radiating outward from the central axis as it goes downward. That is, gap 1203 is shaped like an inverted funnel. Thus the second mixed gas filling the overlying ring-shaped space diffuses through the gap 1203 and flows out of the ring-shaped opening facing the processing chamber 217 toward the outer periphery side of the sample W or the processing chamber 217.

According to such configuration of this embodiment, the first mixed gas of a first composition is introduced into the processing chamber 217 toward the center of the sample W, and the second mixed gas of a second composition is introduced toward the outer periphery side of the sample W. Hence the density of gas and products or the distribution of plasma on the upper surface of the sample W and in the space thereabove inside the processing chamber 217 can be affected to enhance the radial and circumferential uniformity of processing on the sample W.

The gas supply unit 1204 may be vertically divided into a plurality of members. The lower member may be inserted into the center hole from the lower side of the lid member 1201 constituting the inner wall of the processing chamber 217, the upper member may be attached from the upper side of the lid member 1201, and these members may be connected to integrally constitute a gas supply unit 1204. As in the second embodiment, the size of the gap 1203 in this embodiment is configured to be approximately uniform in the circumferential direction so that the gap 1203 is filled with the second mixed gas supplied to the ring-shaped gas channel 1206 to reduce circumferential nonuniformity in the diffusion of gas passing through the gap 1203.

What is claimed is:

1. A plasma processing apparatus for processing a wafer mounted on a sample stage placed in a vacuum processing chamber using a plasma generated in the vacuum processing chamber, the plasma processing apparatus comprising:
    a plate disposed in the vacuum processing chamber above and opposed to the wafer, the plate having a through hole through which a first processing gas is introduced;
    a generally band shaped gap disposed in the vacuum processing chamber; and
    a gas channel which is disposed circumferentially outside of the vacuum processing chamber and communicated with the gap, wherein a second processing gas is supplied inside the gas channel,
    at least one hole or slit disposed between the gas channel and the gap for communicating the gas channel with the gap,
    wherein the gas channel is disposed inside of a ring-shaped member communicated with the gap through the at least one hole or slit provided in an inner peripheral wall of the ring-shaped member
    wherein a first portion of the gap is defined between the inner peripheral wall of the ring-shaped member and a first cylindrical portion of an outer peripheral surface of a ring cover facing and spaced from the inner peripheral wall of the ring-shaped member, and a second portion of the gap is defined between an inner surface of a wall of the vacuum processing chamber and a second portion of the outer peripheral surface of the ring cover facing and spaced from the inner surface of a wall of the vacuum processing chamber
    wherein a height of the gap is configured to be larger than a height or diameter of the hole or slit, and the wafer is processed while the first processing gas and the second processing gas having different compositions are supplied into the vacuum processing chamber.

2. The plasma processing apparatus according to claim 1, wherein the ring cover and the vacuum processing chamber are arranged vertically and adjacently.

3. The plasma processing apparatus according to claim 1, wherein the ring cover and the inner surface of a wall of the vacuum processing chamber face the plasma.

4. The plasma processing apparatus according to claim 1, wherein the gap is formed with a predetermined slope.

5. The plasma processing apparatus according to claim 1, wherein the sample stage includes temperature control means for the wafer, and the outer periphery of the wafer is located outside the wafer mounting surface of the sample stage.

6. The plasma processing apparatus according to claim 1, wherein the gap communicates with the vacuum processing chamber through an opening provided between an end of the second portion of the ring cover and the inner surface of a wall of the vacuum processing chamber.

7. The plasma processing apparatus according to claim 6, wherein the second portion of the outer peripheral surface of the ring cover and the portion of the inner surface of a wall of the vacuum processing chamber facing and spaced from the second portion of the outer peripheral surface of the ring cover are tapered such that the second portion of the gap is directed inwardly towards an outer peripheral edge of the sample stage.

* * * * *